(12) United States Patent
Fisher

(10) Patent No.: US 6,467,414 B1
(45) Date of Patent: Oct. 22, 2002

(54) IGNITOR WITH PRINTED ELECTROSTATIC DISCHARGE SPARK GAP

(75) Inventor: John C. Fisher, Lutz, FL (US)

(73) Assignee: Breed Automotive Technology, Inc., Lakeland, FL (US)

(*) Notice: Subject to any disclaimer, the term of this patent is extended or adjusted under 35 U.S.C. 154(b) by 0 days.

(21) Appl. No.: 09/895,762

(22) Filed: Jun. 29, 2001

(51) Int. Cl.[7] .................................................. F42B 3/18
(52) U.S. Cl. ............................... 102/202.4; 102/202.3; 102/202.5; 102/202.7
(58) Field of Search ........................... 102/202.1, 202.2, 102/202.8, 202.9

(56) References Cited

U.S. PATENT DOCUMENTS

| 2,408,125 A | 9/1946 | Rolfes ......................... 361/248 |
| 3,180,263 A | 4/1965 | Williams, Jr. ............. 102/202.4 |
| 4,261,263 A | 4/1981 | Coultas et al. ............ 102/28 R |
| 4,422,381 A | 12/1983 | Barrett ..................... 102/202.2 |
| 5,179,248 A | 1/1993 | Hartman et al. ......... 102/202.4 |
| 5,309,841 A | 5/1994 | Hartman et al. ......... 102/202.4 |
| 5,322,322 A | 6/1994 | Bark et al. .................. 280/730 |
| 5,433,147 A | 7/1995 | Brede et al. ............. 102/202.2 |
| 5,639,986 A | 6/1997 | Evans ......................... 102/531 |
| 5,835,873 A | 11/1998 | Darby et al. .................. 701/45 |
| 5,988,069 A | 11/1999 | Bailey ..................... 102/202.9 |
| 6,166,452 A | 12/2000 | Adams et al. ............. 307/10.1 |

Primary Examiner—Michael J. Carone
Assistant Examiner—H. A. Blackner
(74) Attorney, Agent, or Firm—Lonnie Drayer; Patrick Steinnon

(57) ABSTRACT

An ignitor has an outer metal can containing a quantity of reactive material for initiating a pyrotechnic material. A circuit board has a first side that is in contact with the reactive material and a second side that is isolated from the reactive material. A metal structure adjacent the circuit board is well grounded. At least two electrical pins are electrically connected to first electrical traces formed on the second side of the circuit board. Electrical discharge gaps are formed by second electrical traces extending from the first electrical traces to form sharp points which extend to within less than about 0.127 mm of a conductive path to ground.

12 Claims, 5 Drawing Sheets

IGNITOR WITH PRINTED ELECTROSTATIC DISCHARGE SPARK GAP

BACKGROUND OF THE INVENTION

The present invention relates to ignitors for explosives and gas generators, and in particular to ignitors that incorporate electrostatic discharge features.

Ignitors for explosives and gas generators present a dichotomy between the desire for reliably consistent ignition and the importance of avoiding unintended initiation. The approach to solving this dichotomy is to reduce the sensitivity of the ignition charge and to increase the power or unique characteristics of the ignition signal. Despite the advances that have been made, static discharge is still a concern, because of the possibility that a static charge could discharge through the ignitor and cause an unintended initiation.

Known solutions to the problem of electrostatic discharge include making provision for an electrostatic charge to be grounded to the ignitor case, thus preventing static current from flowing through the heating element. Such solutions typically require additional costs associated with fabricating the required static discharge structure. U.S. Pat. No. 2,408, 125 describes a means for safeguarding electric ignitors of blasting detonators against accidental firing due to static electricity. The means comprises teeth, projections, edges or other means adapted to constitute discharge points which promote or facilitate the discharge of high-voltage from the means into a grounded mass, wherein the grounded mass consists of the material which resists low voltage currents but readily passes high-voltage currents. U.S. Pat. No. 2,408,125 suggests materials such as Galena, yellow crystalline iron pyrites, or zincite. U.S. Pat. Nos. 5,433,147 and 4,261,263 disclose the use of a spark gap in a detonator to dissipate static electricity. All prior art structures for discharging static electricity require the addition of significant structure, or modifications of previously existing designs.

What is needed is a static discharge mechanism that adds little or no cost, and requires minimal modifications to modern airbag ignitors.

SUMMARY OF THE INVENTION

The ignitor of this invention has a circuit board mounted within a metal can. Mounted on the circuit board are various electronic components used for initiating a semiconductor bridge that functions as a. The heating member ignites a reactive material, which in turn ignites a pyrotechnic material such as an explosive or a gas generating compound. The explosive may be used in mining, construction or demolition operations. The gas generated by a gas generating compound may be used for inflating an airbag in a vehicle or powering a seatbelt pretensioner or other vehicle safety device. The circuit board has a copper surface that is etched to form the copper traces used to connect circuit components. A mask used to form the copper traces is modified to form a static discharge point electrically connected to each of the incoming electrically conducting leads. The sharp two-dimensional trace has a triangular point that concentrates lines of flux. The etched point is spaced between about 0.076 mm to about 0.127 mm (about 0.003 to about 0.005 inch) from the grounded case, or a corresponding triangular point that is conductively connected to the grounded case, so as to form a potential gap which readily discharges static electricity but does not ground ordinary currents flowing through the wire connected to the discharge points.

Because the discharge points only require a change in the mask used to fabricate the traces on the circuit board, nothing is added in the way of processing steps or material to the manufacture of the ignitor. The only change is to remove less copper in the etching solution, reducing costs.

The present invention provides a means for static discharge in an ignitor which does not add cost to the production of the ignitor.

It is a further feature of the present invention to provide an ignitor which is less subject to unintended initiation caused by static electrical discharge.

The present invention further provides a method of adding an electrostatic discharge mechanism to an ignitor that does not require any additional process steps in the manufacture of the ignitor.

Further features and advantages of the invention will be apparent from the following detailed description when taken in conjunction with the accompanying drawings.

DESCRIPTION OF THE PREFERRED EMBODIMENTS

Figure 1:
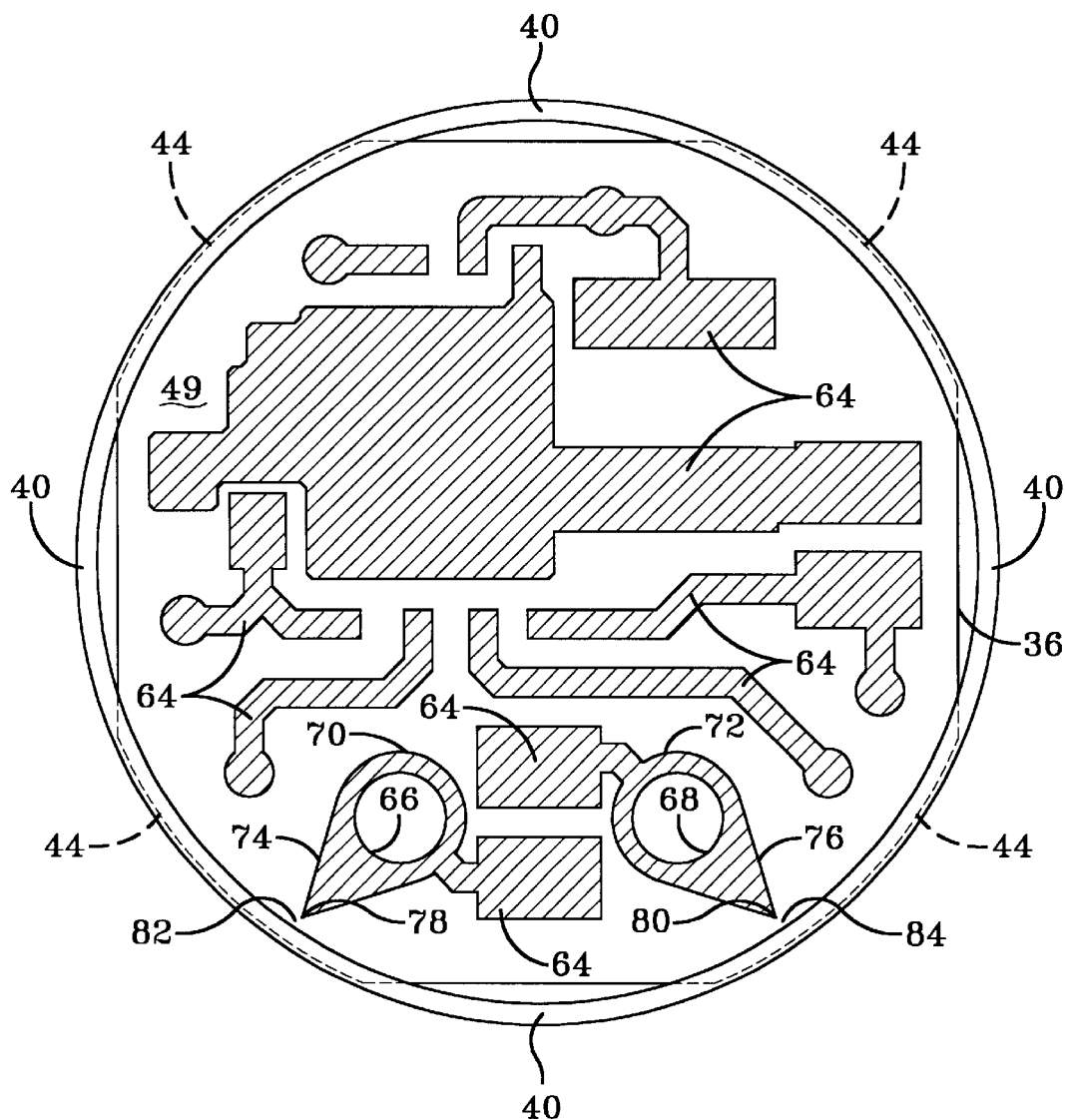
FIG. 1 is a cross-sectional plan view of a circuit board, taken at line 1—1 of FIG. 3, without components attached so that the copper traces are visible, incorporating the static discharge feature of this invention, surrounded by a conducting metal case.
Figure 2:
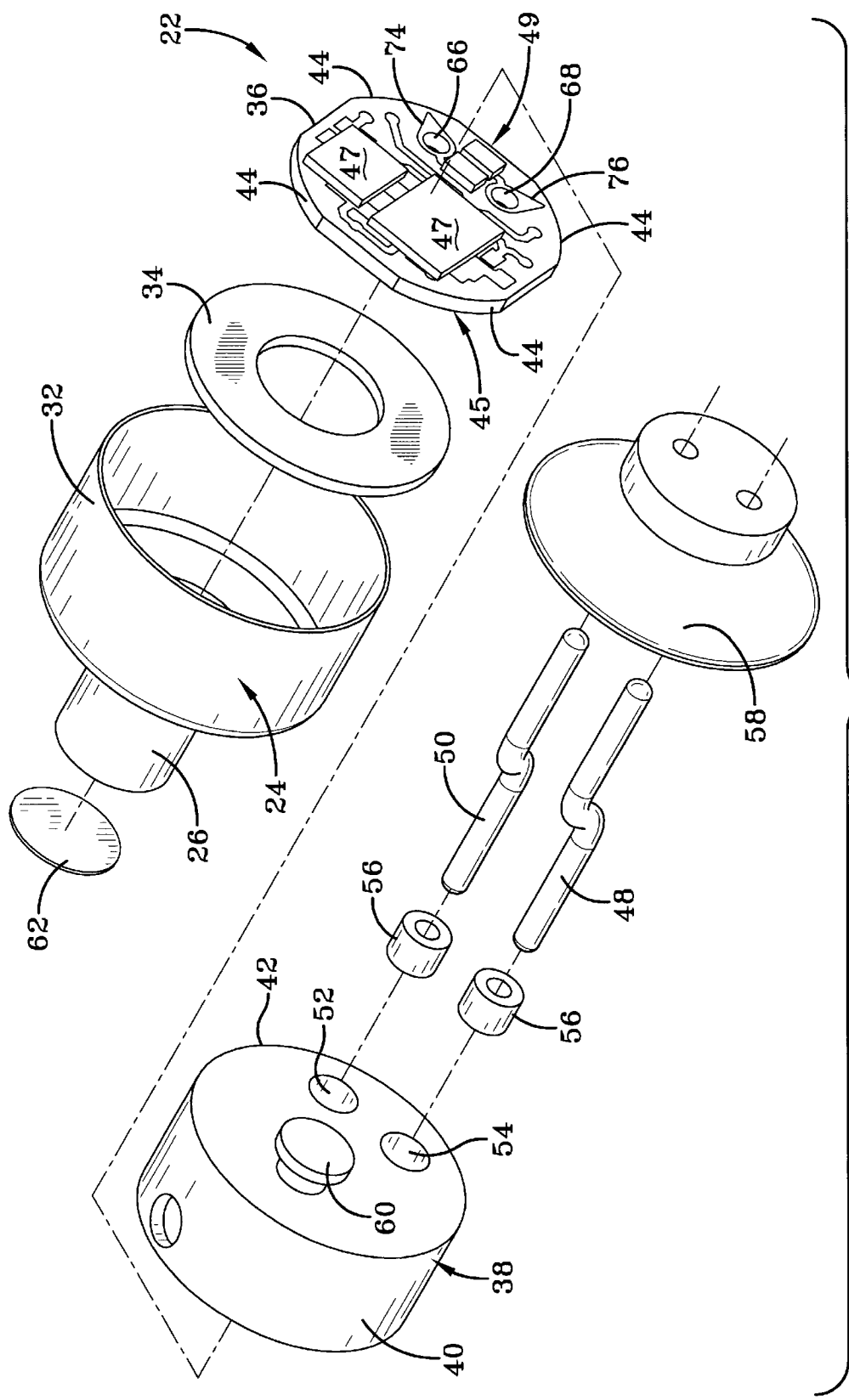
FIG. 2 is an exploded isometric view of an ignitor incorporating the circuit board with the static discharge feature of FIG. 1 or FIG. 1A.
Figure 3:
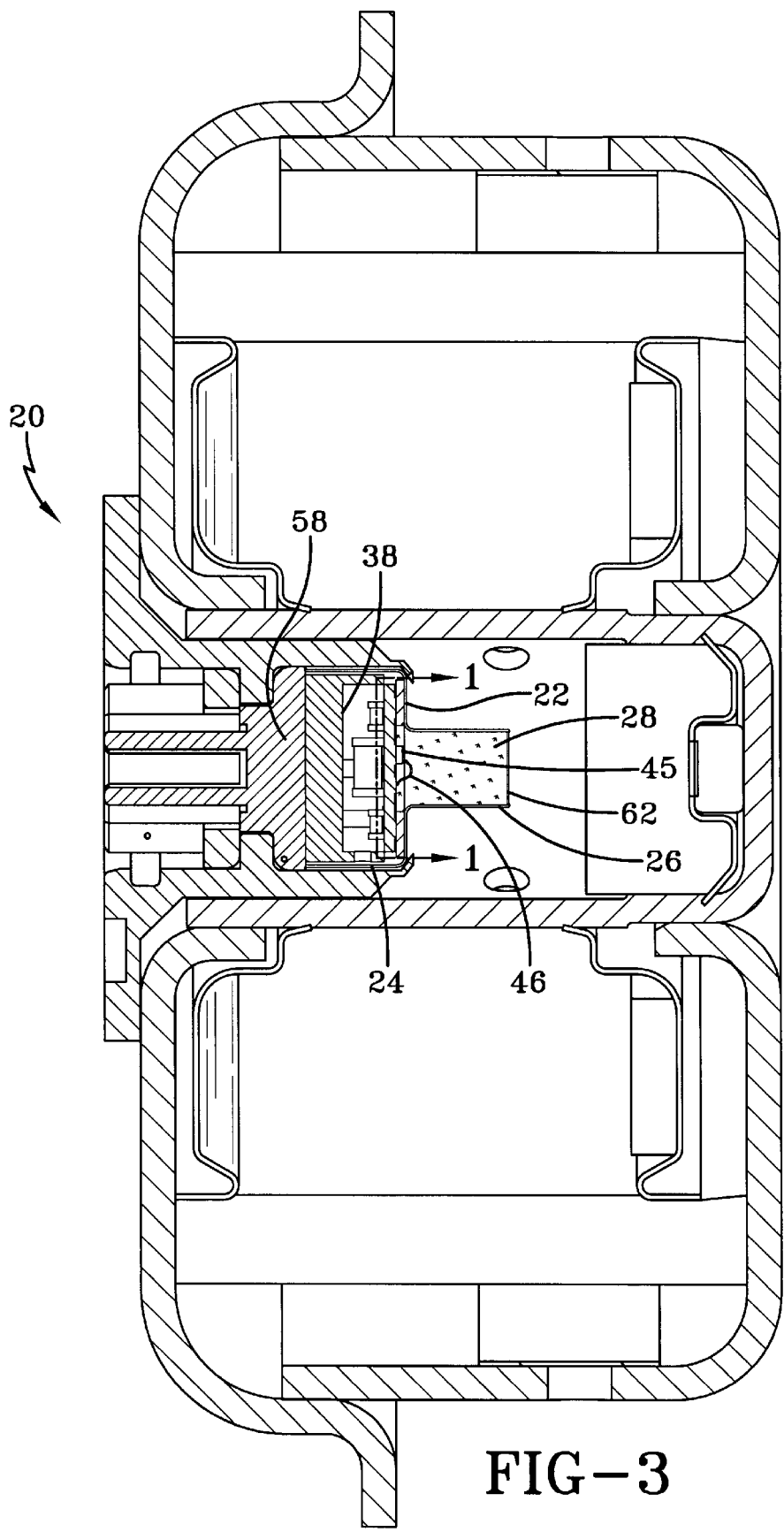
FIG. 3 is a side elevation cross-sectional view of a generator used for inflating an airbag incorporating the ignitor of FIG. 2.

Referring to FIGS. 1–3, wherein like numbers refer to similar parts, a gas generator 20 for inflating an airbag is shown in FIG. 3. Such a gas generator may be used, for example, for inflating an airbag in a vehicle. The gas generator 20 is initiated by an ignitor 22 shown in an exploded view in FIG. 2. It is understood that the ignitor could alternatively be used to initiate an explosive. The ignitor 22 has an outer metal can 24. The metal can 24 has a first cylindrical portion 26 which holds a reactive material 28 for initiating gas generating pellets (not shown for clarity) in the gas generator 20, or for initiating an explosive. A second wider cylindrical portion 32 of the metal can 24 contains an elastomeric washer 34 and a ceramic circuit board 36. The wider cylindrical portion 32 has an open end that is sealed by a closure 38 that has a cylindrical portion 40 and a lid portion 42. The cylindrical portion 40 compresses the curved edges 44 of the circuit board 36 against the elastomeric washer 34. The cylindrical portion 40 of the closure is a metal structure that is adjacent to the circuit board 36 and that is well grounded to the metal can 24.

As shown in FIG. 3, on the side 45 of the circuit board 36 facing the reactive material 28 is located a semiconductor bridge 46 that acts as a heating member. The heating member is positioned in intimate contact with the reactive material 28 in the first cylindrical portion 26 of the metal can 24. A can closure 62 seals the reactive material in a chamber defined by the circuit board, the metal can and the can closure. When sufficient power is supplied to the heating member 46 the reactive material 28 is ignited. It is understood that any suitable heating member, such as a bridge wire, could be used in place of the semiconductor bridge. The side 49 of the circuit board 36 facing away from the reactive material 28 mounts various electrical components 47, typically including a controller that is an application specific integrated circuit (ASIC), microprocessor, or the like. The electrical components 47 are used in igniting the reactive material 28 by means of the heating member 46.

Electrical power is supplied to the electrical components 47 by a electrical pins 48, 50. One of the pins is a power supply pin and another is a return pin. The pins perform the function of conducting power to the circuit board 36 and conducting digital communications signals to and from the electrical components 47 mounted on the circuit board 36. The arrangement and function of the various electrical components 47 are explained more fully in U.S. Pat. Nos. 6,166,452 and 5,835,873 which are incorporated herein by reference.

The electrical pins 48, 50 typically carry relatively low voltages on the order of less than fifty volts. The electrical pins 48, 50 pass through holes 52, 54 in the closure 38. The electrical pins are hermetically sealed to the closure and electrically isolated from the closure by glass seals 56. A plastic endcap 58 is mounted to the lid portion 42 of the closure 38 by a protrusion 60 to prevent the electrical pins 48, 50 from bending. The outer metal can 24, the closure 38, and the can closure 62 generally form a Faraday cage that isolates the circuit board 36 and the reactive material 28 from stray electromagnetic fields. However, an electrostatic discharge which is applied to one or both of the electrical pins 48, 50 could possibly deleteriously affect one or more of the electrical components 47 or the heating member 46.

Previous solutions to the problem of electrostatic discharge were to provide a path to ground, or shunt (e.g. a Zener diode) across the critical semiconductor bridge heating member, which is effective to pass high-voltage associated with electrostatic discharge but not the low voltage associated with the ordinary functioning of the ignitor. Such solutions generally require the addition of one or more components that must be mounted on the circuit board, thus increasing part count and expense.

Figure 1A:
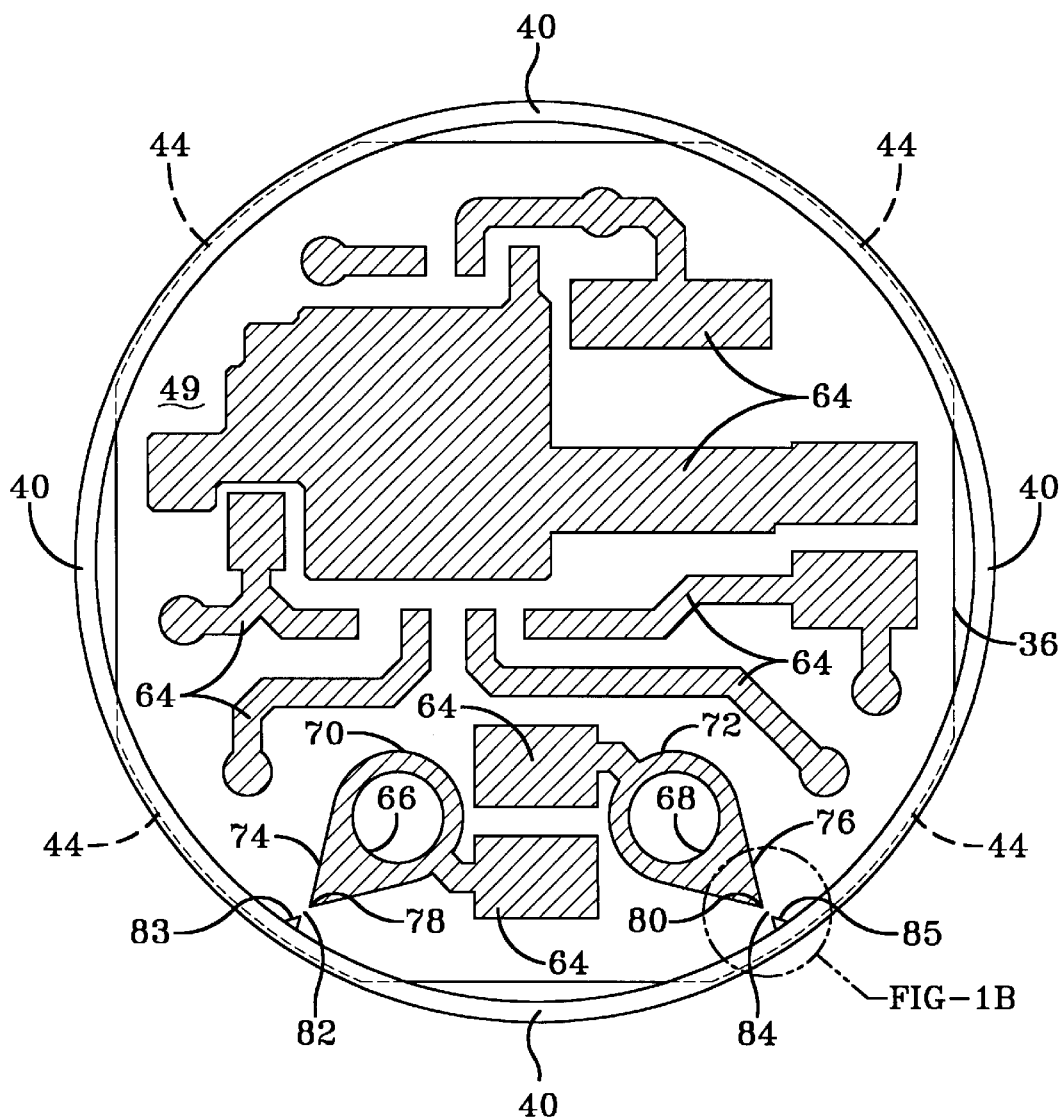
FIG. 1A is a cross-sectional plan view of an example of another circuit board, taken at line 1—1 of FIG. 3, without components attached so that the copper traces are visible, incorporating the static discharge feature of this invention, surrounded by a metal case.

FIGS. 1 and 1A are top plan views of the copper traces 64 on which various electrical components 47 are mounted on the side 49 of the circuit board that is isolated from the reactive material. The electrical components 47 are typically surface mounted to the copper electrical traces. Electrical power and outside signals are provided to the circuit board 36 by the electrical pins 48, 50 which pass through holes 66, 68 in the circuit board. The electrical pins 48, 50 are electrically connected to first electrical copper traces 70, 72 immediately adjacent to the holes 66, 68, by conductive epoxy or solder.

Figure 1B:
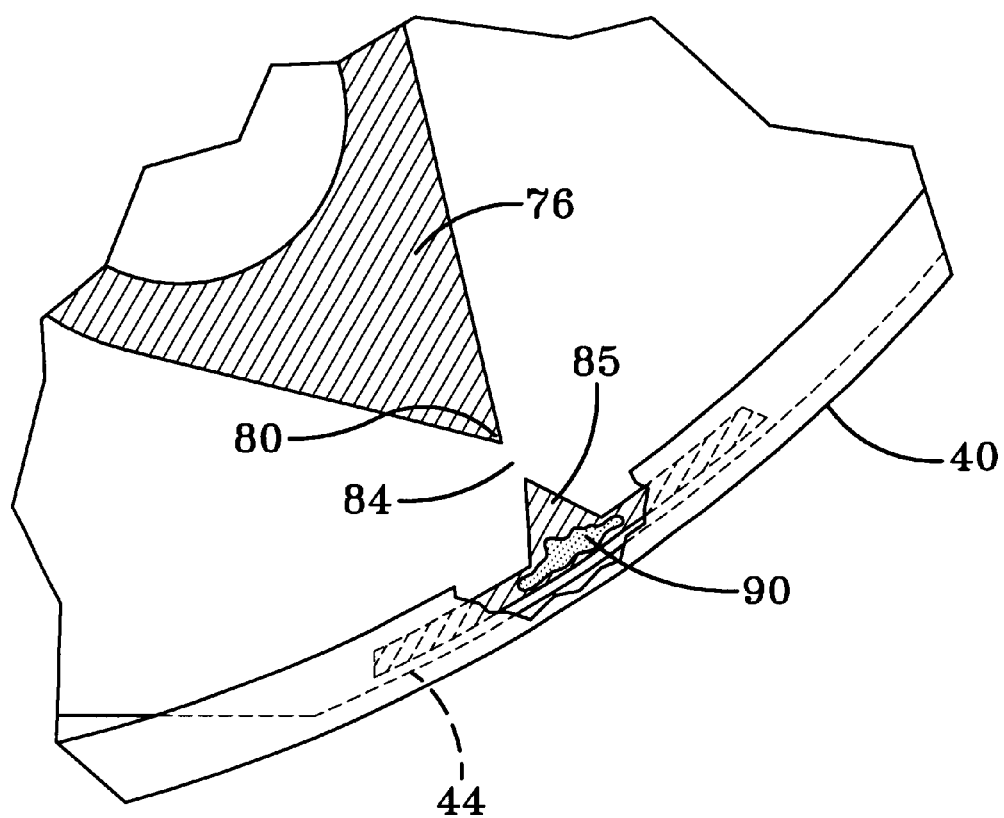
FIG. 1B is an enlarged fragmentary view of the portion of FIG. 1A labeled at 1B.

Electrostatic discharge points are formed on the second electrical traces 74, 76 that extend from the first electrical traces 70, 72 which are immediately adjacent the holes 66, 68 by which power and electrical signals are supplied to the circuit board 36. The second electrical traces 74, 76 form sharp triangular points 78, 80 that have triangular bases that are wider than the width of the electrical pins 48, 50. In the embodiment shown in FIG. 1 the triangular electrical traces 74, 76 extend to within approximately 0.076 mm to 0.127 mm (0.003–0.010 inch) of the well grounded cylindrical portion 40 of the closure 38 to define electrostatic discharge gaps 82, 84. In the embodiment shown in FIG. 1A the triangular electrical traces 74, 76 extend to within approximately 0.076 mm to 0.127 mm (0.003–0.010 inch) of triangular points 83, 85 that are also etched copper traces. As best shown in FIG. 1B, which is an enlarged fragmentary view of the portion of FIG. 1A labeled at 1B, the copper trace forming the triangular point 85 is joined in electrically conductive communication with the metal structure adjacent the circuit board 36, namely the cylindrical portion 40 of the closure 38, by means of a small amount of conductive epoxy or solder 90 to define electrostatic discharge gaps 82, 84. The copper trace forming the point 83 is constructed likewise. In all other respects the embodiments shown in FIGS. 1 and 1A are identical. Because the closure 38 represents ground, the sharp triangular points 78, 80 are thus effectively spaced approximately 0.076 mm to 0.127 mm (0.003–0.010 inch) from a conductive path to ground. A sharp point is known to concentrate lines of electrostatic flux, thus the sharp triangular points 78, 80, 83, 85 provide a controlled point of breakdown where high-voltage static charge is shorted to ground. The sharpness of the points 78, 80, 83, 85 and the angle which converges to the points 78, 80, 83, 85 and the spacing between the points 78, 80, 83, 85 controls the breakdown voltage. It is desirable to have breakdown voltage at approximately 150 volts. To achieve this breakdown voltage, an included angle of approximately 30 degrees should be used to form the triangular points 78, 80, 83, 85. The sharpness of the points is also important and is controlled by the sharpness that can be achieved by the typical etching process used to form the traces. Typically the points will have a radius of less than 0.05 mm (0.002 inch). Because a short to ground does not exist in the absence of a high-voltage discharge, the normal operation of the ignitor and electrical components 47 are not affected by the existence of the electrostatic discharge points 78, 80.

The copper traces 64 on the surface of the circuit board 36 are typically formed by treating a uniform copper layer with a photosensitive resist layer. This photosensitive resist layer is exposed to light through a mask, the photo-resist is processed, removing that portion of material where it is desired to remove portions of the copper layer, to define the copper traces 64. An etching solution is then applied which removes all copper that is not protected by the photo-resist layer. The photo-resist layer is then stripped away leaving the copper traces 64. By simply changing the mask used to form the photo-resist layer the shape of the copper traces may be altered, in particular to form the electrical traces with the sharp triangular points 78, 80, 83, 85. Thus the electrostatic discharge points of this invention are formed of by a simple change to the circuit board mask which does not add any complexity, cost, or steps to the manufacture of the circuit board traces or more generally to the ignitor.

It should be understood that the printed circuit board 36 could be formed of any conventional material that is now used or may come to be used in the making of circuit boards. It should also be understood that the circuit board may have several layers where additional traces are provided, as necessitated by a particular ignitor circuit configuration. It should further be understood that the traces used to form the electrostatic discharge points could be formed of silver, aluminum, or other metals.

It should be understood that the gaps 82, 84 between the electrostatic discharge points and grounded structure could be varied to achieve varying levels of voltage required for electrostatic breakdown.

It should be understood that the number of electrical pins which connect to the circuit board and which utilize the electrostatic discharge feature can be varied from the two shown and described.

It should be understood that wherein the converging angle of the triangular traces 78, 80, 83, 85 is preferably about 30 degrees, angles of approximately 40 degrees while less effective, could be used.

It should be understood that the radius of the sharp points 78, 80, 83, 85 and the gaps 82, 84 shown in FIGS. 1 and 1A are not necessarily drawn to scale but to indicate the relationships which form the electrostatic discharge spark gap.

It should be understood that a plurality of igniters 22 may be connected in parallel to an electrical bus, and when one igniter is initiated, electrical transient may be created by the explosive or the gas generating compound. The electrostatic discharge points 78, 80 can function to prevent an electrical transient from propagating back to the electrical bus. Thus the electrostatic discharge points can be effective to discharge high voltage electrical transients moving into or moving out of the ignitor.

It is understood that the invention is not limited to the particular construction and arrangement of parts herein illustrated and described, but embraces such modified forms thereof as come within the scope of the following claims.

I claim:

1. An ignitor comprising:
    an outer metal can containing a quantity of reactive material for initiating a pyrotechnic material;
    a circuit board having a first side in contact with the reactive material and a second side that is isolated from the reactive material;
    a metal structure adjacent the circuit board which is well grounded;
    at least two electrical pins, each electrical pin being electrically connected to first electrical traces formed on the second side of the circuit board;
    electrostatic discharge spark gaps comprising second electrical traces extending from the first electrical traces to form sharp points which extend to within less than about 0.127 mm of a conductive path to ground.

2. The ignitor of claim 1 wherein the sharp points extend to within less than about 0.127 mm of the metal structure adjacent the circuit board.

3. The ignitor of claim 2 further comprising third electrical traces having sharp point located less than about 0.127 mm from the sharp points of said second electrical traces, said third electrical traces being in conductive communication with said metal structure adjacent the circuit board.

4. The ignitor of claim 1 wherein the sharp points have a radius of curvature of less than about 0.05 mm.

5. The ignitor of claim 1 wherein the sharp points extend to within less than about 0.076 mm of the conductive path to ground.

6. The ignitor of claim 1 wherein the sharp points have sides that converge at about 30 degrees.

7. An ignitor comprising:
    an outer metal can containing a quantity of reactive material;
    a circuit board having a first side in contact with the reactive material and a second side that is isolated from the reactive material on which at least one electrical component is mounted to electrical traces formed on said second side;
    a metal structure adjacent the circuit board which is well grounded to the metal can;
    at least two electrical pins electrically isolated from the outer metal can, each electrical pin being electrically connected to a first electrical trace formed on the second side of the circuit board
    second electrical traces extending from the first electrical traces to form points which extend toward the metal structure adjacent the circuit board to form sharply pointed electrostatic discharge points located less than about 0.127 mm from the metal structure adjacent the circuit board.

8. The ignitor of claim 7 wherein the discharge points extend to within less than about 0.076 mm of the metal structure adjacent the circuit board.

9. The ignitor of claim 7 wherein the discharge points have an electrostatic breakdown voltage of approximately 150 volts.

10. An ignitor comprising:
    an outer metal can containing a quantity of reactive material;
    a circuit board having a first side in contact with the reactive material and a second side that is isolated from the reactive material on which at least one electrical component is mounted to electrical traces formed on said second side;
    a metal structure adjacent the circuit board which is well grounded to the metal can;
    at least two electrical pins electrically isolated from the outer metal can, each electrical pin being electrically connected to a first electrical trace formed on the second side of the circuit board
    second electrical traces extending from the first electrical traces to form points which extend toward the metal structure adjacent the circuit board to form sharply pointed electrostatic sharp discharge points;
    third electrical traces having sharp points located less than about 0.127 mm from the sharp points of said second electrical traces, said third electrical traces being in conductive communication with said metal structure adjacent the circuit board.

11. The ignitor of claim 10 wherein the sharp points of the third electrical traces are located less than about 0.127 mm from the sharp points of said second electrical traces.

12. The ignitor of claim 10 wherein the discharge points have an electrostatic breakdown voltage of approximately 150 volts.

* * * * *